US012750029B2

(12) United States Patent
Kimura et al.

(10) Patent No.: US 12,750,029 B2
(45) Date of Patent: Sep. 29, 2026

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Katsumi Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 818 days.

(21) Appl. No.: 18/143,222

(22) Filed: May 4, 2023

(65) Prior Publication Data

US 2023/0275556 A1 Aug. 31, 2023

Related U.S. Application Data

(63) Continuation of application No. PCT/JP2021/041595, filed on Nov. 11, 2021.

(Continued)

(51) Int. Cl.
*H03H 9/02* (2006.01)
*H03H 9/05* (2006.01)

(52) U.S. Cl.
CPC .... *H03H 9/02157* (2013.01); *H03H 9/02015* (2013.01); *H03H 9/0504* (2013.01)

(58) Field of Classification Search
CPC ........... H03H 9/02157; H03H 9/02015; H03H 9/0504

(Continued)

(56) References Cited

U.S. PATENT DOCUMENTS

2007/0052324 A1* 3/2007 Chen .................. H03H 9/02622 310/313 R
2007/0188047 A1* 8/2007 Tanaka ............... H03H 9/02228 310/313 D (Continued)

FOREIGN PATENT DOCUMENTS

JP 2012257019 A 12/2012
JP 2013214954 A 10/2013

(Continued)

OTHER PUBLICATIONS

International Search Report in PCT/JP2021/041595, mailed Feb. 1, 2022, 3 pages.

(Continued)

*Primary Examiner* — Derek J Rosenau
(74) *Attorney, Agent, or Firm* — Keating & Bennett, LLP

(57) ABSTRACT

An acoustic wave device includes a support substrate having a thickness in a first direction, a piezoelectric layer on the support substrate, and an interdigital transducer electrode on the piezoelectric layer and including first and second electrode fingers extending in a second direction crossing the first direction. The second electrode fingers face the first electrode fingers in a third direction orthogonal or substantially orthogonal to the second direction. The support substrate and the piezoelectric layer include a hollow therebetween at a position at least partially overlapping the interdigital transducer electrode in the first direction. At least one through hole penetrates the piezoelectric layer at a position not overlapping the interdigital transducer electrode in the first direction, and the through hole communicates with the hollow. A reinforcing support extends inside the hollow in a region overlapping the hollow and not overlapping the first and second electrode fingers.

20 Claims, 20 Drawing Sheets

Related U.S. Application Data

(60) Provisional application No. 63/113,213, filed on Nov. 13, 2020.

(58) Field of Classification Search
USPC ...... 310/313 R, 313 A, 313 B, 313 C, 313 D
See application file for complete search history.

(56) References Cited

U.S. PATENT DOCUMENTS

| | | | | |
|---|---|---|---|---|
| 2011/0278993 | A1* | 11/2011 | Iwamoto | H03H 3/02 29/25.35 |
| 2013/0234805 | A1 | 9/2013 | Takahashi | |
| 2014/0152145 | A1 | 6/2014 | Kando et al. | |
| 2017/0187352 | A1 | 6/2017 | Omura | |

FOREIGN PATENT DOCUMENTS

| | | | |
|---|---|---|---|
| WO | 2012073871 | A1 | 6/2012 |
| WO | 2016052129 | A1 | 4/2016 |
| WO | 2016147687 | A1 | 9/2016 |

OTHER PUBLICATIONS

Written Opinion in PCT/JP2021/041595, mailed Feb. 1, 2022, 4 pages.

* cited by examiner

ACOUSTIC WAVE DEVICE

CROSS REFERENCE TO RELATED APPLICATIONS

This application claims the benefit of priority to Provisional Application No. 63/113,213 filed on Nov. 13, 2020 and is a Continuation Application of PCT Application No. PCT/JP2021/041595 filed on Nov. 11, 2021. The entire contents of each application are hereby incorporated herein by reference.

BACKGROUND OF THE INVENTION

1. Field of the Invention

The present disclosure relates to an acoustic wave device.

2. Description of the Related Art

An acoustic wave device is disclosed in Japanese Unexamined Patent Application Publication No. 2012-257019.

With a hollow between a support substrate and a piezoelectric layer in the technique disclosed in Japanese Unexamined Patent Application Publication No. 2012-257019, spurious emission may cause the occurrence of cracks in the piezoelectric layer. It is necessary to prevent the occurrence of cracks in the piezoelectric layer.

SUMMARY OF THE INVENTION

Preferred embodiments of the present invention provide acoustic wave devices in each of which an occurrence of cracks in a piezoelectric layer can be reduced or prevented.

An acoustic wave device according to a preferred embodiment of the present invention includes a support substrate having a thickness in a first direction, a piezoelectric layer on the support substrate, and an interdigital transducer electrode on the piezoelectric layer and including a plurality of first electrode fingers and a plurality of second electrode fingers. The plurality of first electrode fingers extend in a second direction crossing the first direction, and the plurality of second electrode fingers extend in the second direction and face corresponding ones of the plurality of first electrode fingers in a third direction orthogonal or substantially orthogonal to the second direction. The support substrate and the piezoelectric layer include a hollow therebetween at a position at least partially overlapping the interdigital transducer electrode in the first direction. At least one through hole penetrates the piezoelectric layer at a position not overlapping the interdigital transducer electrode in the first direction, and the through hole communicates with the hollow. The acoustic wave device includes a reinforcing support extending inside the hollow in the first direction, in a region overlapping the hollow and not overlapping the plurality of first and second electrode fingers in the first direction.

An acoustic wave device according to a preferred embodiment of the present invention includes a support substrate having a thickness in a first direction, a piezoelectric layer on the support substrate, and an interdigital transducer electrode on the piezoelectric layer and including a plurality of first electrode fingers and a plurality of second electrode fingers. The plurality of first electrode fingers extend in a second direction crossing the first direction, and the plurality of second electrode fingers extend in the second direction and face corresponding ones of the plurality of first electrode fingers in a third direction orthogonal or substantially orthogonal to the second direction. The support substrate and the piezoelectric layer include a hollow therebetween at a position at least partially overlapping the interdigital transducer electrode in the first direction. At least one through hole penetrates the piezoelectric layer at a position not overlapping the interdigital transducer electrode in the first direction, and the through hole communicates with the hollow. The acoustic wave device includes a reinforcing rib not overlapping the plurality of first and second electrode fingers in the first direction. The reinforcing rib protrudes from a lateral wall of the hollow towards an interior of the hollow.

Preferred embodiments of the present invention are each able to reduce or prevent the occurrence of cracks in the piezoelectric layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described in detail with reference to the drawings. The preferred embodiments described below do not limit the present invention. The preferred embodiments of the present invention are presented for illustrative purposes. In modifications and a second preferred embodiment where some components of different preferred embodiments can be replaced or combined, the description of matters common to the first preferred embodiment will be omitted and differences will primarily be described. In particular, the same or substantially the same advantageous effects achieved by the same or corresponding configurations will not be described in the description of each preferred embodiment.

First Preferred Embodiment

Figure 1A:
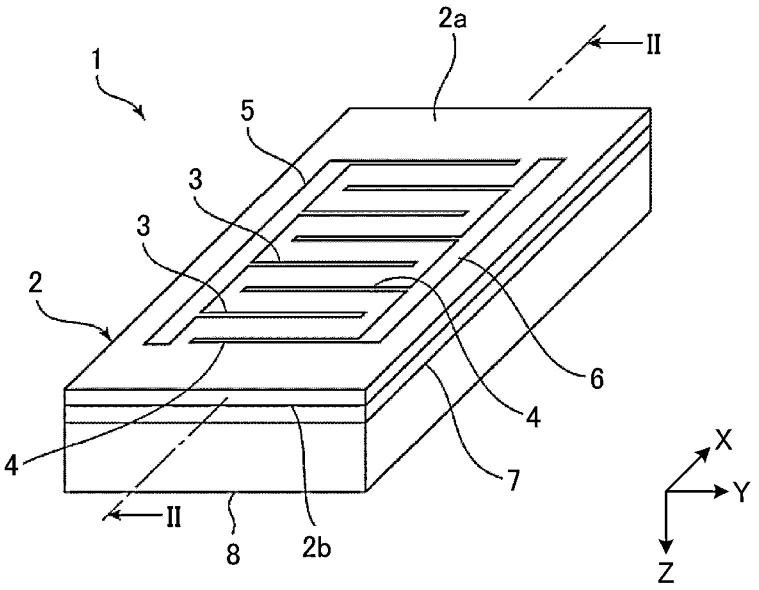
FIG. 1A is a perspective view of an acoustic wave device according to a first preferred embodiment of the present invention.
Figure 1B:
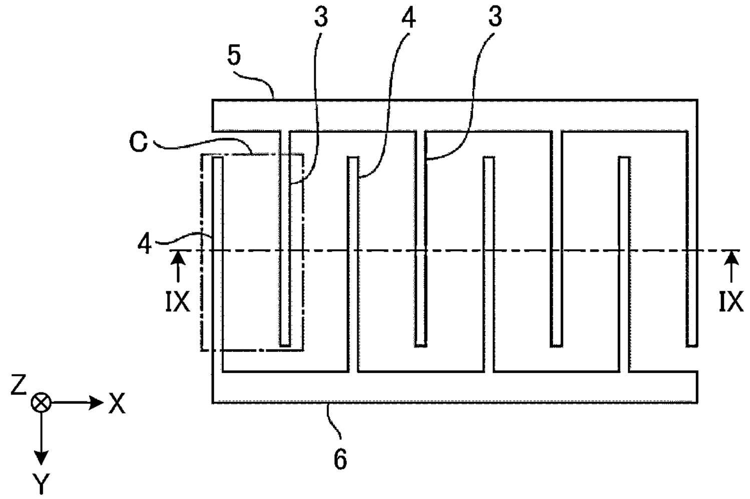
FIG. 1B is a plan view of an electrode structure according to the first preferred embodiment of the present invention.

FIG. 1A is a perspective view of an acoustic wave device according to a first preferred embodiment of the present invention. FIG. 1B is a plan view of an electrode structure according to the first preferred embodiment.

An acoustic wave device 1 according to the first preferred embodiment includes a piezoelectric layer 2 made of, for example, $LiNbO_3$. The piezoelectric layer 2 may be made of, for example, $LiTaO_3$. The cut-angles of $LiNbO_3$ and $LiTaO_3$ are Z-cut in the first preferred embodiment. The cut-angles of $LiNbO_3$ and $LiTaO_3$ may be rotated Y-cut or X-cut. It is preferable that the propagation orientation be Y-propagation and X-propagation about ±30°.

The thickness of the piezoelectric layer 2 is not particularly limited. For effective excitation of first-order thickness shear mode, the thickness of the piezoelectric layer 2 is preferably, for example, greater than or equal to about 50 nm and less than or equal to about 1000 nm.

The piezoelectric layer 2 includes a first principal surface 2*a* and a second principal surface 2*b* opposite each other in the Z direction. Electrode fingers 3 and 4 are arranged on the first principal surface 2*a*.

Here, the electrode finger 3 is an example of "first electrode finger", and the electrode finger 4 is an example of "second electrode finger". In FIGS. 1A and 1B, a plurality of electrode fingers 3 are connected to a first busbar 5, and a plurality of electrode fingers 4 are connected to a second busbar 6. The plurality of electrode fingers 3 and the plurality of electrode fingers 4 are interdigitated with each other. The electrode fingers 3, the electrode fingers 4, the first busbar 5, and the second busbar 6 thus define an interdigital transducer electrode.

The electrode fingers 3 and 4 are rectangular or substantially rectangular in shape and have a length direction. In a direction orthogonal or substantially orthogonal to the length direction, adjacent ones of the electrode fingers 3 and 4 face each other. Both the length direction of the electrode fingers 3 and 4 and the direction orthogonal or substantially orthogonal to the length direction of the electrode fingers 3 and 4 are directions that cross the thickness direction of the piezoelectric layer 2. Therefore, adjacent ones of the electrode fingers 3 and 4 can also be considered facing each other in the direction crossing the thickness direction of the piezoelectric layer 2. Hereinafter, the thickness direction of the piezoelectric layer 2 may be described as a Z direction (or first direction), a direction orthogonal or substantially orthogonal to the length direction of the electrode fingers 3 and 4 may be described as an X direction (or third direction), and the length direction of the electrode fingers 3 and 4 may be described as a Y direction (or second direction).

The length direction of the electrode fingers 3 and 4 may be interchanged with the direction orthogonal or substantially orthogonal to the length direction of the electrode fingers 3 and 4 illustrated in FIGS. 1A and 1B. That is, the electrode fingers 3 and 4 may extend in the direction in which the first busbar 5 and the second busbar 6 extend in FIGS. 1A and 1B. In this case, the first busbar 5 and the second busbar 6 extend in the direction in which the electrode fingers 3 and 4 extend in FIGS. 1A and 1B. A plurality of pairs of adjacent electrode fingers 3 and 4, the electrode finger 3 being connected to one potential and the electrode finger 4 being connected to the other potential, are arranged in the direction orthogonal or substantially orthogonal to the length direction of the electrode fingers 3 and 4.

Here, the electrode fingers 3 and 4 adjacent to each other are not in direct contact, but are spaced apart from each other. The electrode fingers 3 and 4 adjacent to each other are not provided with other electrodes (including other electrode fingers 3 and 4) connected to hot and ground electrodes therebetween. The number of pairs of adjacent electrode fingers 3 and 4 does not necessarily need to be an integer, and there may be, for example, 1.5 pairs or 2.5 pairs.

A center-to-center distance, or pitch, between the electrode fingers 3 and 4 is preferably, for example, greater than or equal to about 1 μm and less than or equal to about 10 μm. The center-to-center distance between the electrode fingers 3 and 4 is a distance from the center of the width dimension of the electrode finger 3 in the direction orthogonal or substantially orthogonal to the length direction of the electrode finger 3 to the center of the width dimension of the electrode finger 4 in the direction orthogonal to the length direction of the electrode finger 4.

When the electrode fingers 3 and 4 include at least a plurality of electrode fingers 3 or a plurality of electrode fingers 4 (i.e., there are greater than or equal to 1.5 electrode pairs, each including the electrode finger 3 and the electrode finger 4), the center-to-center distance between the electrode fingers 3 and 4 is the average of the center-to-center distances between adjacent ones of the greater than or equal to 1.5 pairs of electrode fingers 3 and 4.

The width of the electrode fingers 3 and 4, or the dimension of the electrode fingers 3 and 4 in the direction in which the electrode fingers 3 and 4 face each other, is preferably, for example, greater than or equal to about 150 nm and less than or equal to about 1000 nm. The center-to-center distance between the electrode fingers 3 and 4 is a distance from the center of the dimension (width dimension) of the electrode finger 3 in the direction orthogonal or substantially orthogonal to the length direction of the electrode finger 3 to the center of the dimension (width dimension) of the electrode finger 4 in the direction orthogonal or substantially orthogonal to the length direction of the electrode finger 4.

In the first preferred embodiment, where a Z-cut piezoelectric layer is used, the direction orthogonal or substantially orthogonal to the length direction of the electrode fingers 3 and 4 is a direction orthogonal or substantially orthogonal to the polarization direction of the piezoelectric layer 2. This is not applicable when a piezoelectric body with other cut-angles is used as the piezoelectric layer 2. Here, the term “orthogonal” may refer not only to being exactly orthogonal, but also to being substantially orthogonal (e.g., the angle between the direction orthogonal to the length direction of the electrode fingers 3 and 4 and the polarization direction is about 90°±10°).

Figure 2:
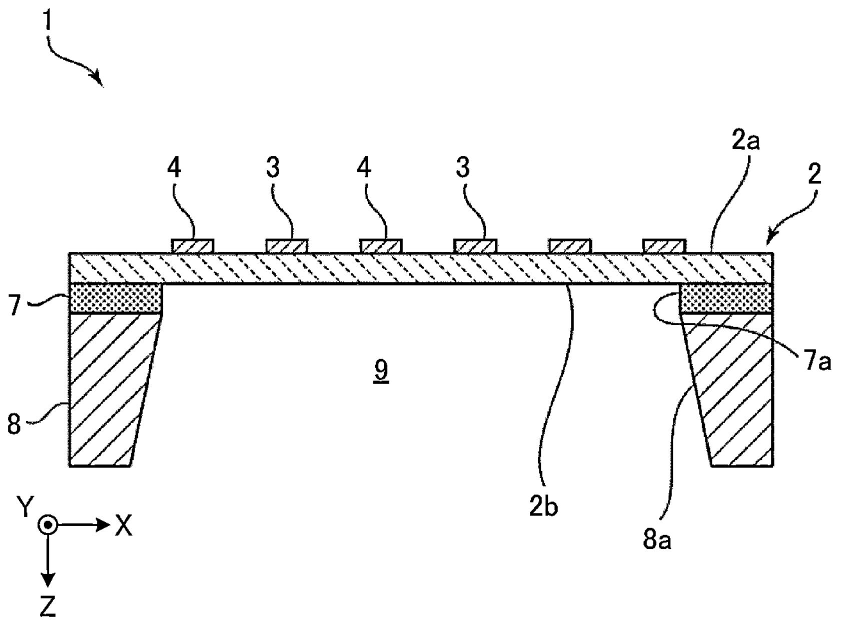
FIG. 2 is a cross-sectional view taken along line II-II of FIG. 1A.

A support substrate 8 is disposed adjacent to the second principal surface 2*b* of the piezoelectric layer 2, with a dielectric film 7 interposed therebetween. The dielectric film 7 and the support substrate 8 have a frame shape. As illustrated in FIG. 2, the dielectric film 7 and the support substrate 8 are provided with cavities 7*a* and 8*a*, respectively, which define a hollow (air gap) 9.

The hollow 9 is provided to allow vibration of an excitation region C of the piezoelectric layer 2. Therefore, the support substrate 8 is disposed adjacent to the second principal surface 2*b*, with the dielectric film 7 interposed therebetween, so as not to overlap at least one pair of electrode fingers 3 and 4. The dielectric film 7 is optional. That is, the support substrate 8 may be disposed on the second principal surface 2*b* of the piezoelectric layer 2, either directly or indirectly.

The dielectric film 7 is made of, for example, silicon oxide. The dielectric film 7 can be made of an appropriate insulating material, such as, for example, silicon nitride or alumina, other than silicon oxide.

The support substrate 8 is made of, for example, Si. The plane orientation of the Si substrate on the surface thereof adjacent to the piezoelectric layer 2 may be (100), (110), or (111). It is preferable that the Si is a high-resistance Si with a resistivity of, for example, greater than or equal to about 4 kΩ. The support substrate 8 can also be made of an appropriate insulating material or semiconductor material. Examples of the material used to form the support substrate 8 include piezoelectric materials, such as aluminum oxide, lithium tantalate, lithium niobate, and crystals, various ceramics, such as alumina, magnesia, sapphire, silicon nitride, aluminum nitride, silicon carbide, zirconia, cordierite, mullite, steatite, and forsterite, dielectrics, such as diamond and glass, and a semiconductor, such as gallium nitride.

The plurality of electrode fingers 3 and 4, the first busbar 5, and the second busbar 6 are made of an appropriate metal, such as, for example, Al, or an appropriate alloy, such as AlCu alloy. In the first preferred embodiment, the electrode fingers 3 and 4, the first busbar 5, and the second busbar 6 have a multilayer structure including, for example, a Ti film and an Al film on the Ti film. The Ti film may be replaced by a different adhesion layer.

To drive the acoustic wave device 1, an alternating-current voltage is applied between the plurality of electrode fingers 3 and the plurality of electrode fingers 4. More specifically, an alternating-current voltage is applied between the first busbar 5 and the second busbar 6. This can produce resonance characteristics using first-order thickness shear mode bulk waves excited in the piezoelectric layer 2.

In the acoustic wave device 1, d/p is, for example, less than or equal to about 0.5, where d is the thickness of the piezoelectric layer 2 and p is the center-to-center distance between any adjacent electrode fingers 3 and 4 of the plurality of pairs of electrode fingers 3 and 4. This allows effective excitation of the first-order thickness shear mode bulk waves and can produce good resonance characteristics. It is more preferable that d/p is, for example, less than or equal to about 0.24. This produces better resonance characteristics.

As in the first preferred embodiment, when the electrode fingers 3 and 4 include at least a plurality of electrode fingers 3 or a plurality of electrode fingers 4 (i.e., there are greater than or equal to 1.5 electrode pairs, each including the electrode finger 3 and the electrode finger 4), the center-to-center distance p between the adjacent electrode fingers 3 and 4 is the average center-to-center distance between all adjacent electrode fingers 3 and 4.

In the acoustic wave device 1 of the first preferred embodiment configured as described above, the Q factor does not decrease easily even if the number of pairs of the electrode fingers 3 and 4 is reduced for the purpose of size reduction. This is because the acoustic wave device 1 is a resonator that does not require reflectors on both sides, and thus does not suffer significant propagation loss. The acoustic wave device 1 does not require reflectors, because it uses first-order thickness shear mode bulk waves.

Figure 3A:
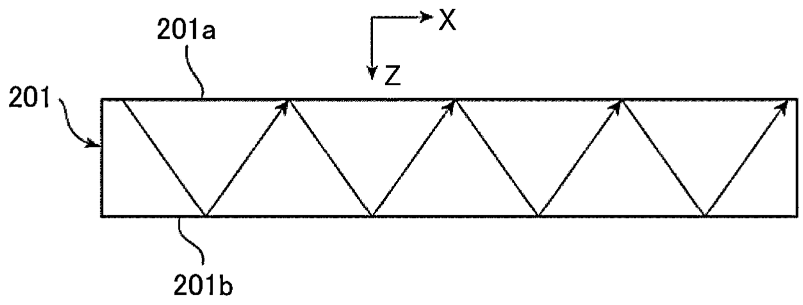
FIG. 3A is a schematic cross-sectional view for explaining Lamb waves propagating in a piezoelectric layer of a comparative example.
Figure 3B:
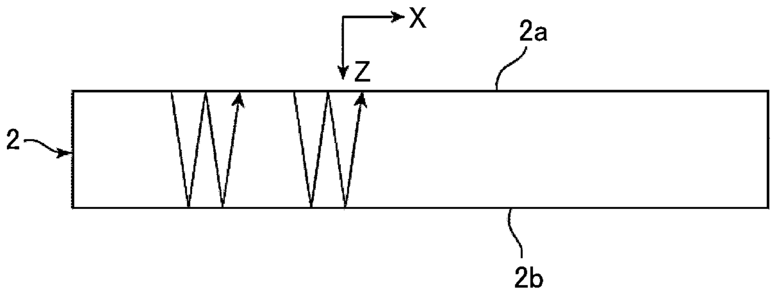
FIG. 3B is a schematic cross-sectional view for explaining first-order thickness shear mode bulk waves propagating in a piezoelectric layer of the first preferred embodiment of the present invention.
Figure 4:
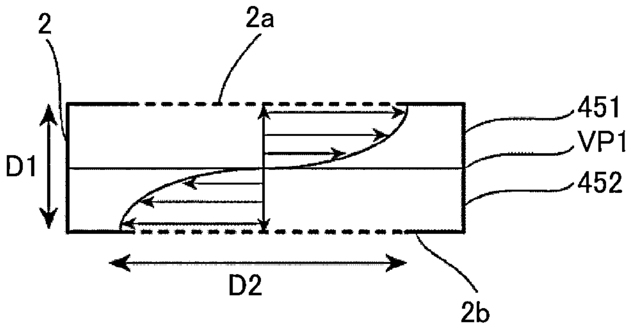
FIG. 4 is a schematic cross-sectional view for explaining an amplitude direction of first-order thickness shear mode bulk waves propagating in the piezoelectric layer of the first preferred embodiment of the present invention.

FIG. 3A is a schematic cross-sectional view for explaining Lamb waves propagating in a piezoelectric layer of a comparative example. FIG. 3B is a schematic cross-sectional view for explaining first-order thickness shear mode bulk waves propagating in the piezoelectric layer of the first preferred embodiment. FIG. 4 is a schematic cross-sectional view for explaining an amplitude direction of first-order thickness shear mode bulk waves propagating in the piezoelectric layer of the first preferred embodiment.

FIG. 3A illustrates Lamb waves propagating in a piezoelectric layer of an acoustic wave device, such as that described in Japanese Unexamined Patent Application Publication No. 2012-257019. As illustrated in FIG. 3A, the waves propagate in a piezoelectric layer 201 as indicated by arrows. The piezoelectric layer 201 includes a first principal surface 201*a* and a second principal surface 201*b*. A thickness direction, which connects the first principal surface 201*a* and the second principal surface 201*b*, is the Z direction. The X direction is a direction in which the electrode fingers 3 and 4 of the interdigital transducer electrode are arranged. The Lamb waves propagate in the X direction, as illustrated in FIG. 3A. Although the entire piezoelectric layer 201 vibrates, the Lamb waves (plate waves) propagate in the X direction. Reflectors are thus provided on both sides to produce resonance characteristics. This causes wave propagation loss and results in a low Q factor when the number of pairs of the electrode fingers 3 and 4 is reduced for size reduction.

In the acoustic wave device of the first preferred embodiment, as illustrated in FIG. 3B, vibration displacement takes place in the thickness shear direction. Therefore, the waves propagate substantially in the direction connecting the first principal surface 2*a* and the second principal surface 2*b* of the piezoelectric layer 2, that is, substantially in the Z direction and resonate. In other words, the X direction component of the waves is much smaller than the Z direction component of the waves. Since the wave propagation in the Z direction produces resonance characteristics, the acoustic wave device requires no reflectors. This reduces or prevents propagation loss that occurs during propagation to reflectors. Therefore, the Q factor does not decrease easily even if the number of electrode pairs, each including the electrode fingers 3 and 4, is reduced for the purpose of size reduction.

As illustrated in FIG. 4, the amplitude direction of first-order thickness shear mode bulk waves in a first region 451 included in the excitation region C (see FIG. 1B) of the piezoelectric layer 2 is opposite that in a second region 452 included in the excitation region C. FIG. 4 schematically illustrates how bulk waves behave when a voltage that makes the potential of the electrode finger 4 higher than that of the electrode finger 3 is applied between the electrode fingers 3 and 4. In the excitation region C, the first region 451 is a region between a virtual plane VP1 and the first principal surface 2*a*, and the second region 452 is a region between the virtual plane VP1 and the second principal surface 2*b*. The virtual plane VP1 is orthogonal or substantially orthogonal to the thickness direction of the piezoelectric layer 2 and divides the piezoelectric layer 2 into two.

The acoustic wave device 1 includes at least one electrode pair including the electrode fingers 3 and 4. Since the acoustic wave device 1 is not configured to propagate waves in the X direction, it is not necessarily required that there be more than one electrode pair including the electrode fingers 3 and 4. That is, the acoustic wave device 1 simply requires at least one electrode pair.

For example, the electrode finger 3 is an electrode connected to the hot potential, and the electrode finger 4 is an electrode connected to the ground potential. Alternatively, the electrode finger 3 and the electrode finger 4 may be connected to the ground potential and the hot potential, respectively. In the first preferred embodiment, the at least one electrode pair is a combination of electrodes, one connected to the hot potential and the other connected to the ground potential, as described above, and no floating electrode is provided.

Figure 5:
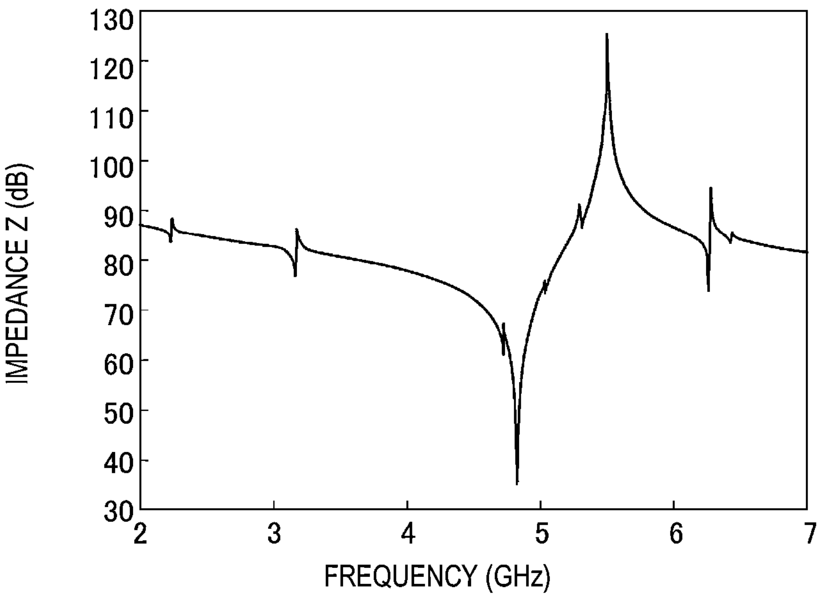
FIG. 5 is an explanatory diagram illustrating an example of resonance characteristics of the acoustic wave device according to the first preferred embodiment of the present invention.

FIG. 5 is an explanatory diagram illustrating an example of resonance characteristics of the acoustic wave device according to the first preferred embodiment. The design parameters of the acoustic wave device 1 having the resonance characteristics illustrated in FIG. 5 are as follows.

Piezoelectric layer 2: $LiNbO_3$ with Euler angles (about 0°, about 0°, about 90°)

Thickness of piezoelectric layer 2: about 400 nm

Length of excitation region C (see FIG. 1B): about 40 µm

Number of electrode pairs, each including electrode fingers 3 and 4: 21 pairs Center-to-center distance (pitch) between electrode fingers 3 and 4: about 3 µm Width of electrode fingers 3 and 4: about 500 nm d/p: about 0.133

Dielectric film 7: 1 µm-thick silicon oxide film

Support substrate 8: Si

The excitation region C (see FIG. 1B) is a region where the electrode fingers 3 and 4 overlap, as viewed in the X direction orthogonal or substantially orthogonal to the length direction of the electrode fingers 3 and 4. The length of the excitation region C is a dimension of the excitation region C along the length direction of the electrode fingers 3 and 4.

In the first preferred embodiment, all electrode pairs, each including the electrode fingers 3 and 4, have the same or substantially the same interelectrode distance. That is, the electrode fingers 3 and 4 are arranged with an equal or substantially equal pitch.

As shown in FIG. 5, good resonance characteristics with a fractional bandwidth of about 12.5% are obtained without reflectors.

In the first preferred embodiment, for example, d/p is less than or equal to about 0.5 and more preferably less than or equal to about 0.24, where d is the thickness of the piezoelectric layer 2 and p is the center-to-center distance between the electrode fingers 3 and 4. This will now be described with reference to FIG. 6.

Figure 6:
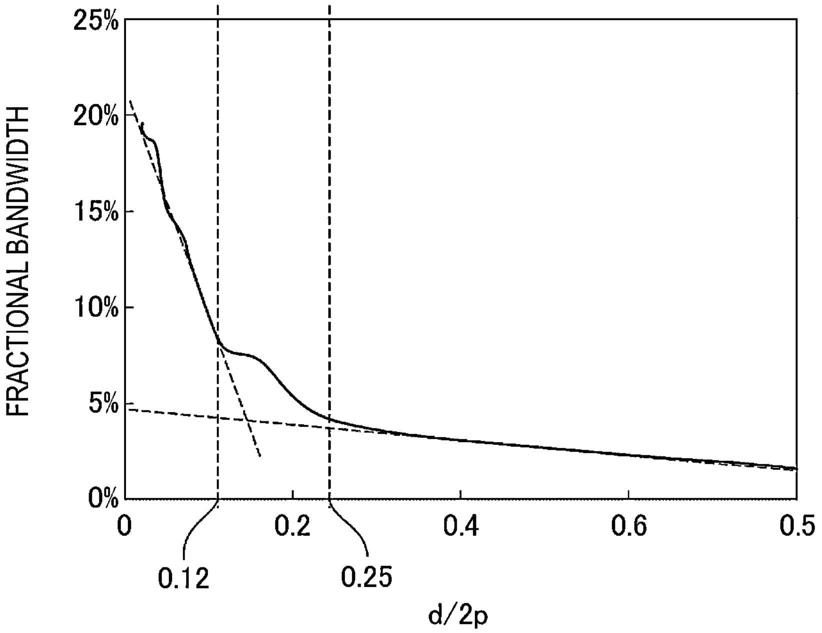
FIG. 6 is an explanatory diagram illustrating a relation between d/2p and a fractional bandwidth of the acoustic wave device of the first preferred embodiment of the present invention serving as a resonator, where p is a center-to-center distance or average center-to-center distance between adjacent electrodes and d is an average thickness of the piezoelectric layer.

A plurality of acoustic wave devices are produced by varying d/2p of the acoustic wave device having the resonance characteristics illustrated in FIG. 5. FIG. 6 is an explanatory diagram illustrating a relation between d/2p and a fractional bandwidth of the acoustic wave device of the first preferred embodiment serving as a resonator, where p is the center-to-center distance between adjacent electrode fingers or the average center-to-center distance between adjacent electrode fingers, and d is the average thickness of the piezoelectric layer 2.

As illustrated in FIG. 6, if d/2p exceeds about 0.25 (or d/p>about 0.5), the fractional bandwidth falls below about 5% even when d/p is adjusted. On the other hand, if d/2p about 0.25 (or d/p about 0.5) is satisfied, the fractional bandwidth can be made greater than or equal to about 5% by varying d/p within the range, that is, a resonator having a high coupling coefficient can be obtained. If d/2p is less than or equal to about 0.12, that is, if d/p is less than or equal to about 0.24, the fractional bandwidth can be made as high as about 7% or more. Additionally, by adjusting d/p within this range, a resonator with a wider fractional bandwidth and a higher coupling coefficient can be produced. Thus, by making d/p less than or equal to about 0.5, a resonator with a higher coupling coefficient using first-order thickness shear mode bulk waves can be obtained.

It is simply required that there be at least one electrode pair. In the case of one electrode pair, p is the center-to-center distance between adjacent electrode fingers 3 and 4. In the case of greater than or equal to 1.5 electrode pairs, p may be the average center-to-center distance between adjacent electrode fingers 3 and 4.

If the piezoelectric layer 2 varies in thickness, the average thickness of the piezoelectric layer 2 may be used as the thickness d of the piezoelectric layer 2.

Figure 7:
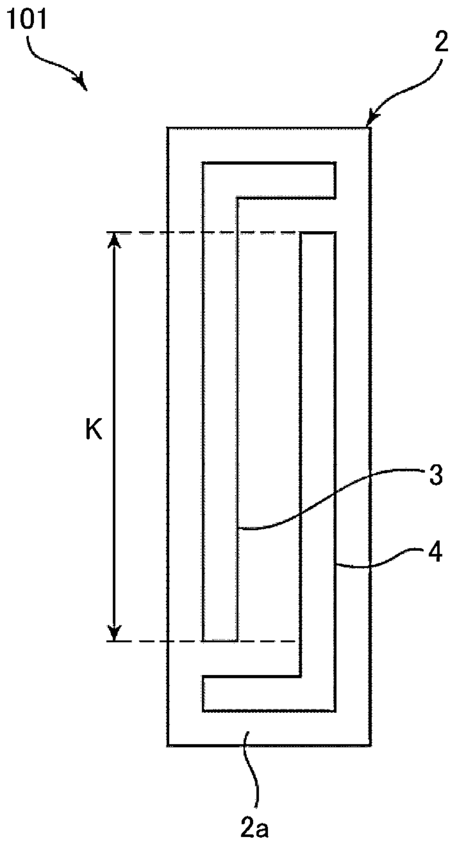
FIG. 7 is a plan view illustrating an example of one electrode pair in an acoustic wave device according to the first preferred embodiment of the present invention.

FIG. 7 is a plan view illustrating an example of one electrode pair in an acoustic wave device according to the first preferred embodiment. An acoustic wave device 101 includes one electrode pair including the electrode fingers 3 and 4 on the first principal surface 2*a* of the piezoelectric layer 2. K in FIG. 7 indicates an overlap width. As described above, the acoustic wave device according to the present preferred embodiment may include only one electrode pair. Even in this case, the first-order thickness shear mode bulk waves can be effectively excited if d/p is less than or equal to 0.5.

The excitation region C is a region where any adjacent electrode fingers 3 and 4 of the plurality electrode fingers 3 and 4 overlap as viewed in the direction in which the adjacent electrode fingers 3 and 4 face each other. It is preferable in the acoustic wave device 1 that MR about 1.75(d/p)+0.075 is satisfied, where MR is a metallization ratio MR of the adjacent electrode fingers 3 and 4 to the excitation region C. Spurious emission can be effectively reduced or prevented in this case. This will be described with reference to FIG. 8 and FIG. 9.

Figure 8:
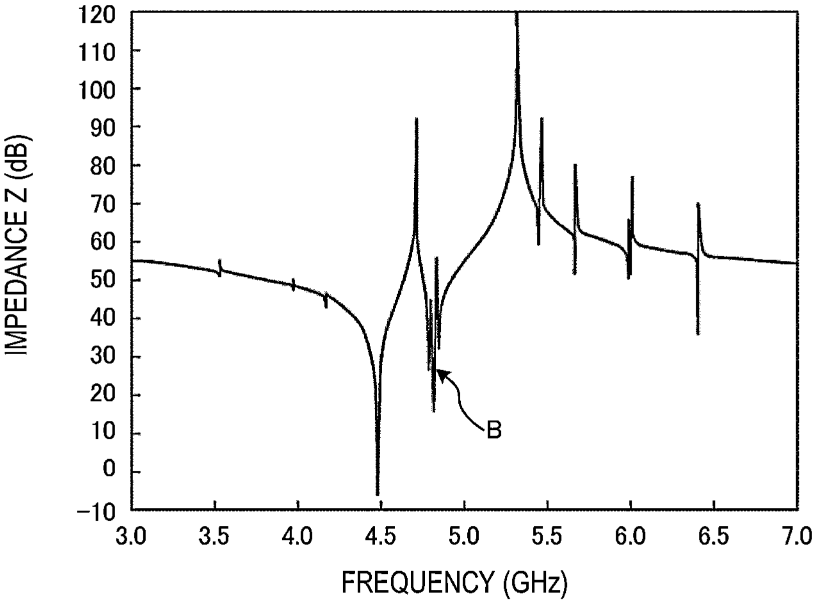
FIG. 8 is a reference diagram illustrating an example of resonance characteristics of the acoustic wave device according to the first preferred embodiment of the present invention.

FIG. 8 is a reference diagram illustrating an example of resonance characteristics of the acoustic wave device according to the first preferred embodiment. Arrow B indicates a spurious emission appearing between the resonant frequency and the anti-resonant frequency. In this example, d/p is about 0.08, $LiNbO_3$ has Euler angles (about 0°, about 0°, about 90°), and the metallization ratio MR is about 0.35.

The metallization ratio MR will now be described with reference to FIG. 1B. To focus on one pair of electrode fingers 3 and 4 of the electrode structure in FIG. 1B, the description assumes that only the one pair of electrode fingers 3 and 4 is provided. In this case, a region enclosed by a dash-dot line is the excitation region C. When the electrode fingers 3 and 4 are viewed in the direction orthogonal or substantially orthogonal to the length direction of the electrode fingers 3 and 4, or viewed in the direction in which the electrode fingers 3 and 4 face each other, the excitation region C includes a portion of the electrode finger 3 overlapping the electrode finger 4, a portion of the electrode finger 4 overlapping the electrode finger 3, and a portion between the electrode fingers 3 and 4 where the electrode fingers 3 and 4 face each other. The metallization ratio MR is the ratio of the area of the electrode fingers 3 and 4 in the excitation region C to the area of the excitation region C. That is, the metallization ratio MR is the ratio of the area of a metallized portion to the area of the excitation region C.

When a plurality of pairs of electrode fingers 3 and 4 are provided, MR may be the ratio of the area of metallized portions included in all excitation regions C to the sum of the areas of the excitation regions C.

Figure 9:
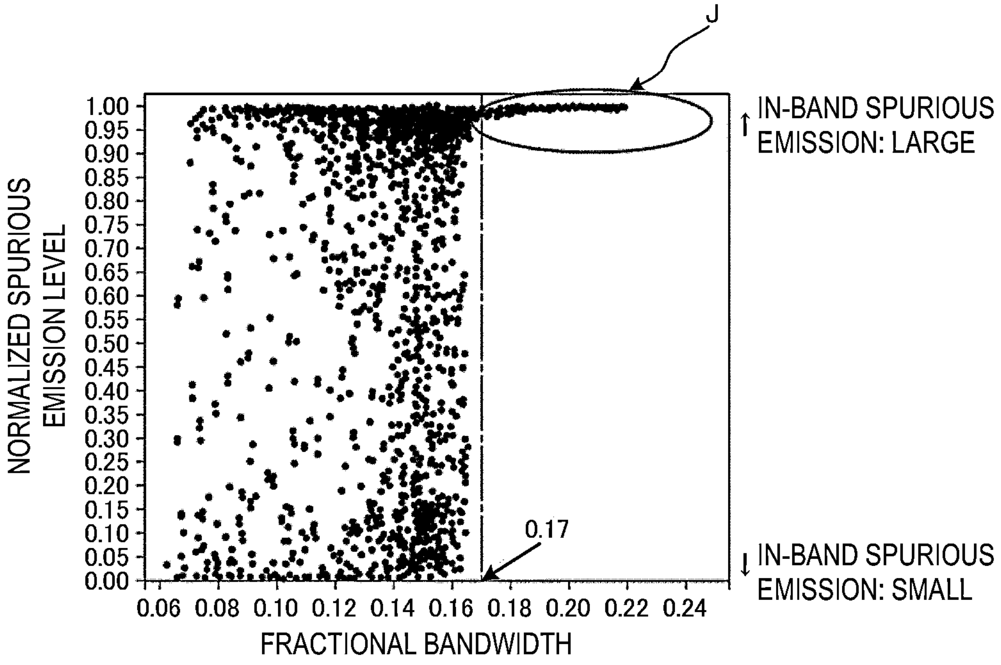
FIG. 9 is an explanatory diagram illustrating a relation between the fractional bandwidth of the acoustic wave device of the first preferred embodiment of the present invention constituting each of many acoustic wave resonators, and the amount of phase rotation of impedance of spurious emission normalized at 180 degrees to represent the level of spurious emission.

FIG. 9 is an explanatory diagram illustrating a relationship between the fractional bandwidth of the acoustic wave device of the first preferred embodiment defining each of many acoustic wave resonators, and the amount of phase rotation of impedance of spurious emission normalized at 180 degrees to represent the level of spurious emission. The fractional bandwidth is adjusted by varying the film thickness of the piezoelectric layer 2 or the dimensions of the electrode fingers 3 and 4. FIG. 9 illustrates a result of using a Z-cut $LiNbO_3$ layer as the piezoelectric layer 2. A similar tendency is observed when the piezoelectric layer 2 with other cut-angles is used.

In the region enclosed by oval J in FIG. 9, the level of spurious emission is as high as about 1.0. As shown in FIG. 9, when the fractional bandwidth exceeds about 0.17 or about 17%, a large spurious emission with a spurious emission level of about 1 or higher appears in the pass band even if parameters defining the fractional bandwidth are changed. That is, as in the resonance characteristics illustrated in FIG. 8, a large spurious emission indicated by arrow B appears in the band. Therefore, it is preferable that the fractional bandwidth is, for example, less than or equal to about 17%. In this case, adjusting the film thickness of the piezoelectric layer 2 or the dimensions of the electrode fingers 3 and 4 can reduce or prevent spurious emission.

Figure 10:
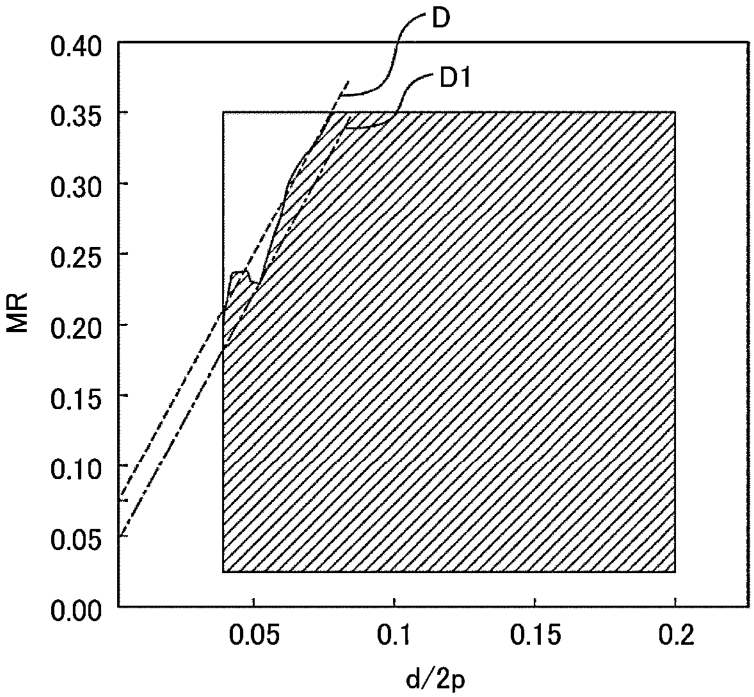
FIG. 10 is an explanatory diagram illustrating a relationship between d/2p, metallization ratio MR, and fractional bandwidth.

FIG. 10 is an explanatory diagram illustrating a relation between d/2p, metallization ratio MR, and fractional bandwidth. Various acoustic wave devices 1 of the first preferred embodiment are made by varying d/2p and MR to measure the fractional bandwidths. In FIG. 10, a hatched region to the right of broken line D is a region where the fractional bandwidth is less than or equal to about 17%. The boundary between the hatched and non-hatched regions is represented by MR=about 3.5(d/2p)+0.075 or MR=about 1.75(d/p)+0.075, and preferably MR≤about 1.75(d/p)+0.075. In this case, it is easier to make the fractional bandwidth less than or equal to about 17%. A more preferable region is one that is to the right of the boundary represented by MR=about 3.5(d/2p)+0.05, indicated by dash-dot line D1 in FIG. 10. That is, if MR≤about 1.75(d/p)+0.05 is satisfied, the fractional bandwidth can be reliably made less than or equal to about 17%.

Figure 11:
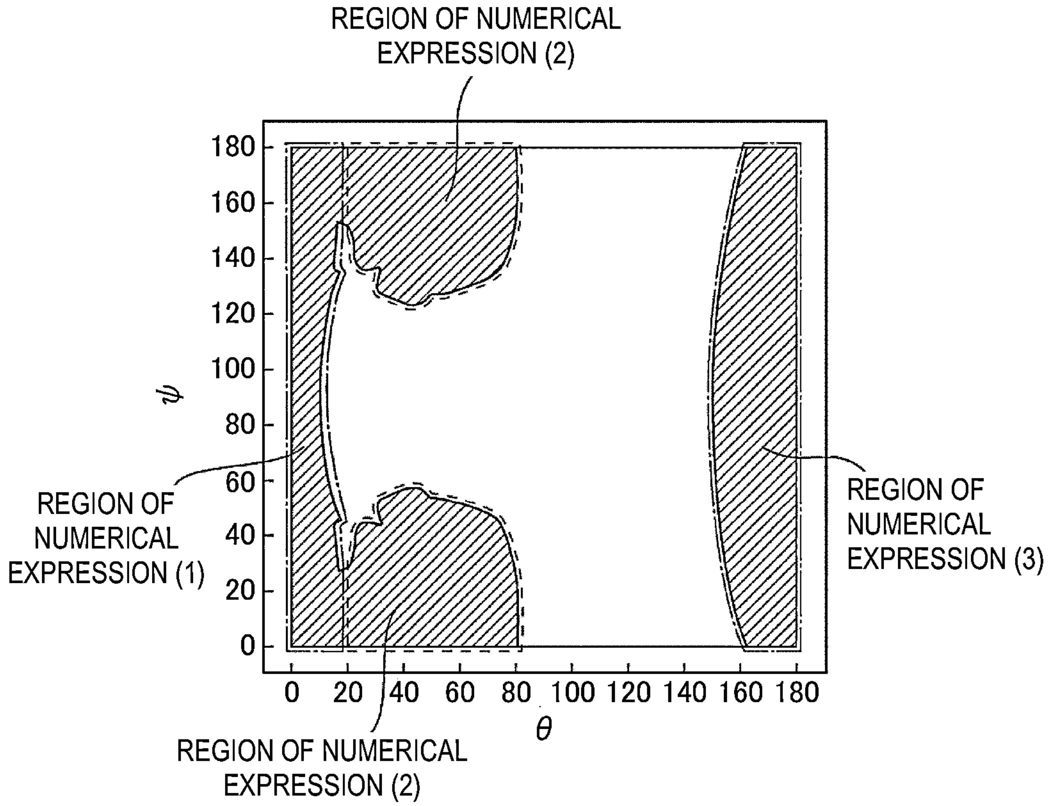
FIG. 11 is an explanatory diagram illustrating a map of fractional bandwidth with respect to Euler angles (0°, θ, ψ) of $LiNbO_3$ obtained when d/p is brought as close as possible to 0.

FIG. 11 is an explanatory diagram illustrating a map of fractional bandwidth with respect to Euler angles (0°, θ, ψ) of $LiNbO_3$ obtained when d/p is brought as close as possible to 0. Hatched regions in FIG. 11 are regions where a fractional bandwidth of at least greater than or equal to about 5% can be obtained. By approximating the ranges of these regions, ranges defined by numerical expression (1), numerical expression (2) and numerical expression (3) described below are obtained.

$$(0°\pm10°,\ 0°\text{ to }20°,\ \text{any }\psi) \qquad \text{numerical expression (1)}$$

$$(0°\pm10°,\ 20°\text{ to }80°,\ 0°\text{ to }60°\,(1-(\theta-50)^2/900)^{1/2})\text{ or }(0°\pm10°,\ 20°\text{ to }80°,\ [180°-60°\,(1-(\theta-50)^2/900)^{1/2}]\text{ to }180°) \qquad \text{numerical expression (2)}$$

$$(0°\pm10°,\ [180°-30°\,(1-(\psi-90)^2/8100)^{1/2}]\text{ to }180°,\ \text{any }\psi) \qquad \text{numerical expression (3)}$$

The ranges of the Euler angles defined by numerical expression (1), numerical expression (2), or numerical expression (3) are preferable, because a sufficiently wide fractional bandwidth can be achieved.

Figure 12:
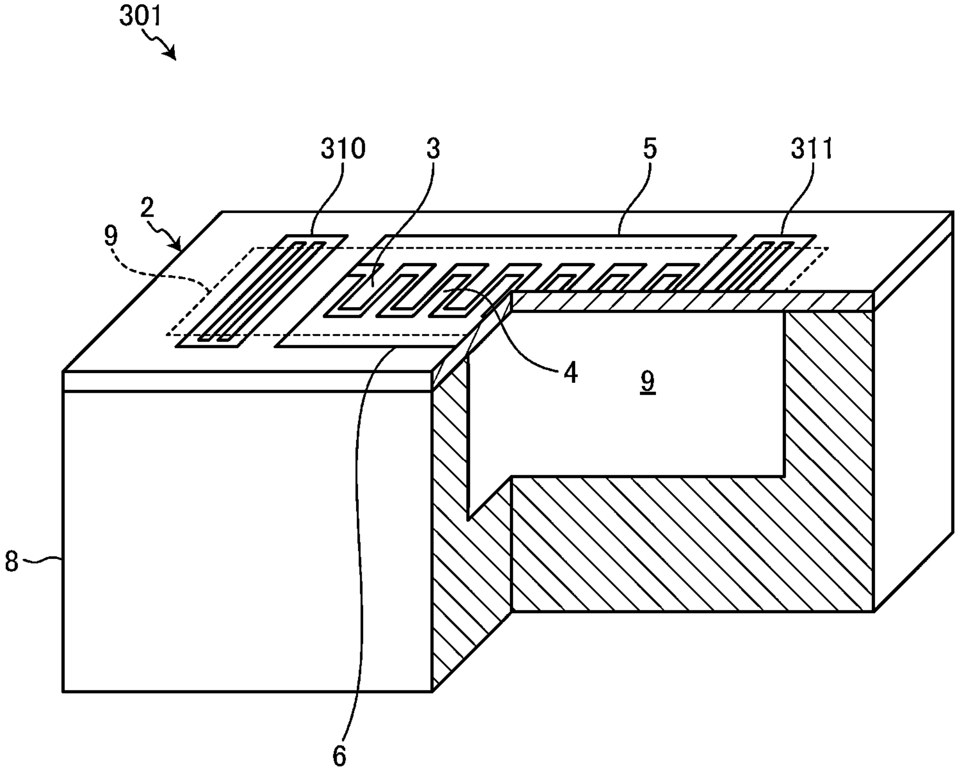
FIG. 12 is a partial cutaway perspective view for explaining an acoustic wave device according to a preferred embodiment of the present invention.

FIG. 12 is a partial cutaway perspective view for explaining an acoustic wave device according to a preferred embodiment of the present invention. In FIG. 12, the outer edge of the hollow 9 is indicated by a broken line. An acoustic wave device according to a preferred embodiment of the present invention may use plate waves. In this case, an acoustic wave device 301 includes reflectors 310 and 311, as illustrated in FIG. 12. The reflectors 310 and 311 are disposed on both sides of the electrode fingers 3 and 4 on the piezoelectric layer 2 in the propagation direction of acoustic waves. In the acoustic wave device 301, Lamb waves (or plate waves) are excited by applying an alternating-current electric field to the electrode fingers 3 and 4 above the hollow 9. With the reflectors 310 and 311 on both sides, the resonance characteristics based on Lamb waves (or plate waves) can be obtained.

As described above, the acoustic wave devices 1 and 101 use first-order thickness shear mode bulk waves. In the acoustic wave devices 1 and 101, the first and second electrode fingers 3 and 4 are adjacent electrodes and d/p is, for example, less than or equal to about 0.5, where d is the thickness of the piezoelectric layer 2 and p is the center-to-center distance between the first and second electrode fingers 3 and 4. This can improve the Q factor even when the acoustic wave device is reduced in size.

In the acoustic wave devices 1 and 101, the piezoelectric layer 2 is made of, for example, lithium niobate or lithium tantalate. The first principal surface 2*a* or the second principal surface 2*b* of the piezoelectric layer 2 include thereon the first and second electrode fingers 3 and 4 facing each other in the direction crossing the thickness direction of the piezoelectric layer 2. The first and second electrode fingers 3 and 4 are preferably covered with a protective film.

Figure 13A:
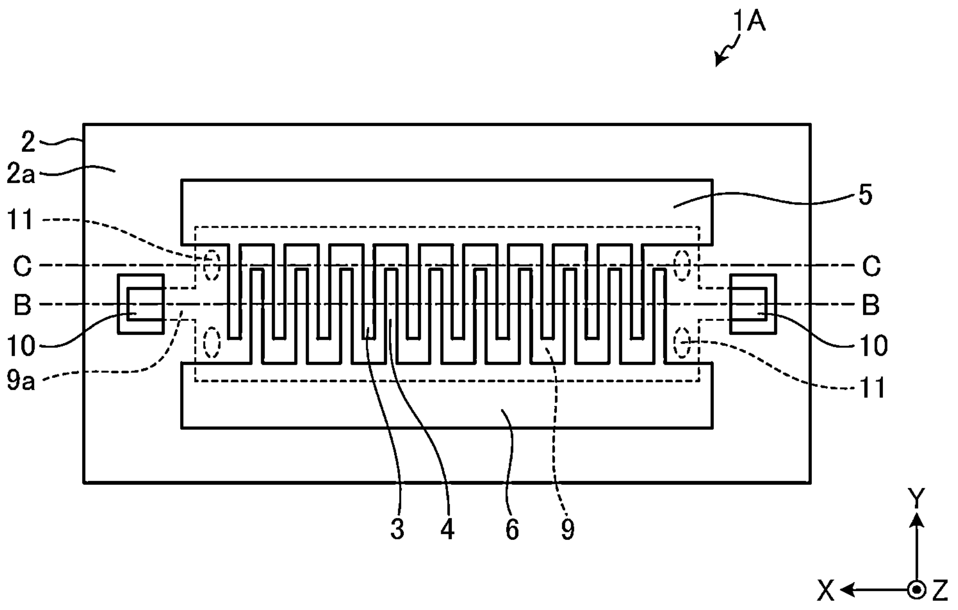
FIG. 13A is a plan view illustrating Example 1 of the acoustic wave device according to the first preferred embodiment of the present invention.
Figure 13B:
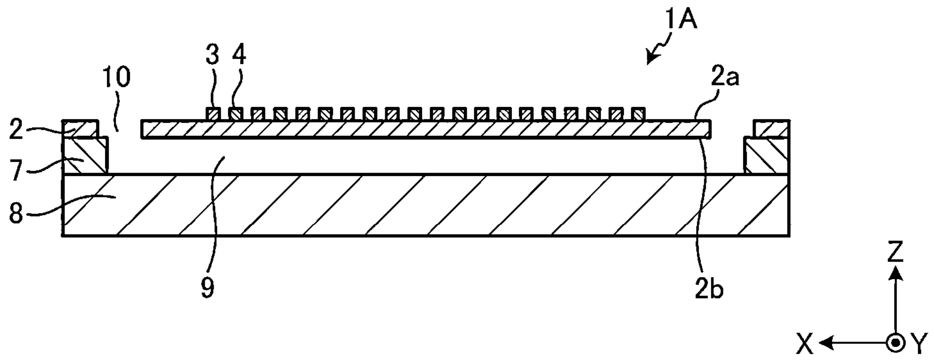
FIG. 13B is a cross-sectional view taken along line B-B of FIG. 13A.
Figure 13C:
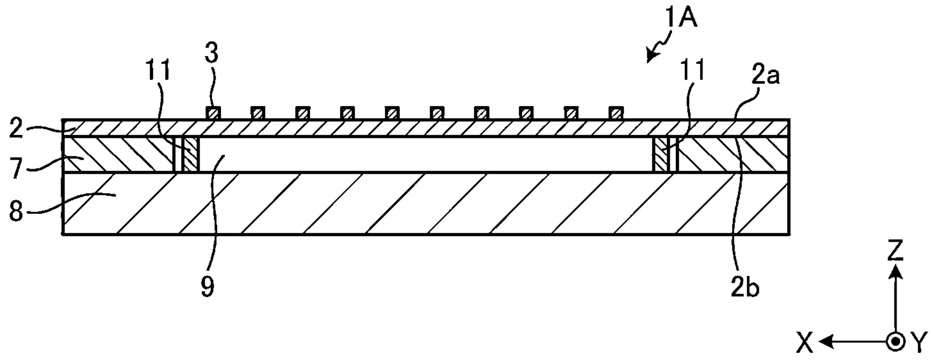
FIG. 13C is a cross-sectional view taken along line C-C of FIG. 13A.

FIG. 13A is a plan view illustrating Example 1 of the acoustic wave device according to the first preferred embodiment. FIG. 13B is a cross-sectional view taken along line B-B of FIG. 13A. FIG. 13C is a cross-sectional view taken along line C-C of FIG. 13A. As illustrated in FIG. 13A, an acoustic wave device 1A includes a through hole 10 communicating with the hollow 9, and a reinforcing support 11 disposed in the hollow 9 and configured to support the piezoelectric layer 2 and the support substrate 8. In Example 1, the support substrate 8 is a plate member without the cavity 8*a*. Therefore, the hollow 9 is a space surrounded by the second principal surface 2*b* of the piezoelectric layer 2, the inner wall of the cavity 7*a* in the dielectric film 7, and a surface of the support substrate 8 adjacent to the piezoelectric layer 2. The hollow 9 includes an extended passage 9*a* which is a hollow region communicating with the through hole 10.

The through hole 10 is a hole penetrating the piezoelectric layer 2. The through hole 10 is provided at a position at least partially overlapping the hollow 9 and not overlapping the interdigital transducer electrode in plan view in the Z direction. In Example 1,as illustrated in FIG. 13A, two through holes 10 are provided on center line B-B of the interdigital transducer electrode in the Y direction, on both sides of the interdigital transducer electrode in the X direction. Also, as illustrated in FIG. 13B, the through holes 10 communicate with the respective extended passages 9*a* of the hollow 9 in the Z direction, described below. Accordingly, in Example 1, as illustrated in FIG. 13B, the through holes 10 communicate with each other through the hollow 9. Although it is preferable that the piezoelectric layer 2 is provided with at least two through holes 10, the piezoelectric layer 2 may be provided with one through hole 10. Although the through holes 10 are rectangular or substantially rectangular in plan view in the Z direction in Example 1, the shape of the through holes 10 is not limited to this. For example, the through holes 10 may have a circular or substantially circular or other polygonal shape.

The extended passages 9*a* are regions of the hollow 9 communicating with the respective through holes 10. In plan view in the Z direction, the extended passages 9*a* are disposed at both ends of the hollow 9 in the X direction, at positions overlapping the respective through holes 10. That is, the extended passages 9*a* are disposed at points communicating with the respective through holes 10. In Example 1, each extended passage 9*a* is disposed in a region not overlapping the first and second electrode fingers 3 and 4 in plan view in the Z direction. The extended passage 9*a* is preferably smaller in area than a region of the hollow 9 overlapping the interdigital transducer electrode. The maximum size of the extended passage 9*a* in the Y direction is preferably smaller than the maximum size of the region of the hollow 9 overlapping the interdigital transducer electrode in the Y direction. In the example illustrated in FIG. 13A, the extended passage 9*a* is rectangular or substantially rectangular in plan view in the Z direction. However, the shape of the extended passage 9*a* is not limited to this. For example, the extended passage 9*a* may have a trapezoidal or substantially trapezoidal, a semi-circular or substantially semi-circular, or other shape.

The reinforcing support 11 is disposed in the hollow 9 and configured to support the piezoelectric layer 2 and the support substrate 8. As illustrated in FIG. 13A, the reinforcing support 11 is disposed in a region overlapping the hollow 9 and not overlapping the first and second electrode fingers 3 and 4 in plan view in the Z direction. As illustrated in FIG. 13C, the reinforcing support 11 is disposed inside the hollow 9. The upper end of the reinforcing support 11 in the Z direction is bonded to the piezoelectric layer 2, and the lower end of the reinforcing support 11 in the Z direction is bonded to the support substrate 8. This enables the reinforcing support 11 to support the piezoelectric layer 2, and thus can reduce or prevent warpage of the piezoelectric layer 2 and the occurrence of cracks.

In Example 1, the reinforcing support 11 is disposed near the extended passage 9*a* in the X direction. More specifically, in plan view in the Z direction, four reinforcing supports 11 are disposed at both ends of a region of the hollow 9 except the extended passages 9*a* in the X direction, at positions not overlapping the areas communicating with the extended passages 9*a* in the Y direction. Each reinforcing support 11 is a cylindrical member having a length in the Z direction. In this case, the exterior or lateral surface of the reinforcing support 11 preferably has a curved surface. This can reduce or prevent obstruction of the flow of etchant into the hollow 9 during manufacturing of the acoustic wave device 1A. The configuration and shape of the reinforcing supports 11 illustrated in FIG. 13A is merely an example and is not limited to this. It is simply required that there be at least one reinforcing support 11. The reinforcing support 11 may have any shape as long as the lateral surface includes a curved surface.

The reinforcing support 11 is preferably made of the same material as the dielectric film 7. This can facilitate formation of the reinforcing supports 11 during manufacturing of the acoustic wave device 1A. The reinforcing support 11 is not limited to this, and may be made of a metal, such as, for example, Ti, Al, Cu, or Ni. The resulting high thermal conductivity of the reinforcing support 11 can improve heat dispersion performance of the acoustic wave device 1A.

The extended passages 9*a* of the hollow 9 are optional for the acoustic wave device 1 according to the first preferred embodiment. Example 2 will be described, with reference to a drawing, as an example where the hollow 9 does not include the extended passages 9*a*.

Figure 14:
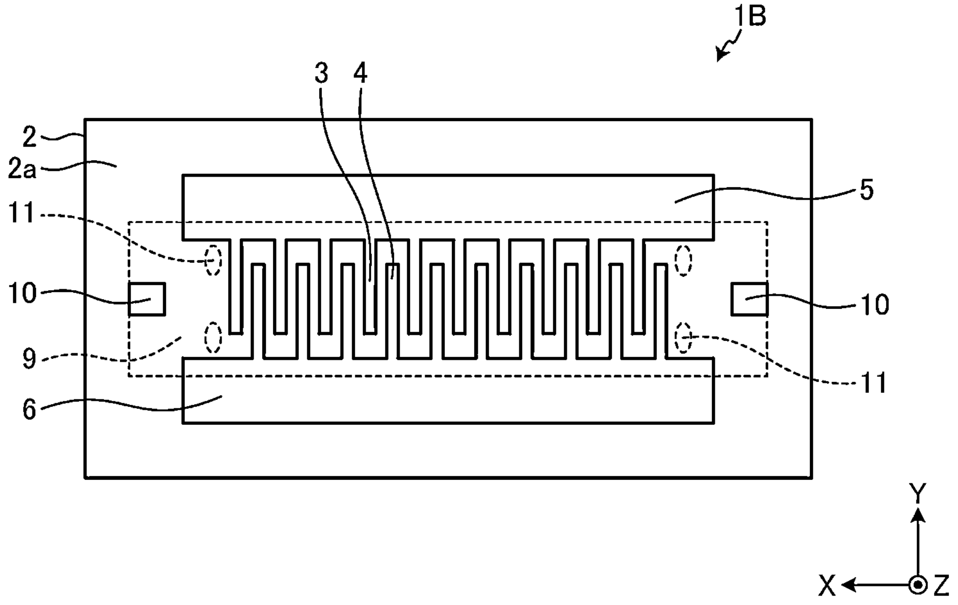
FIG. 14 is a plan view illustrating Example 2 of the acoustic wave device according to the first preferred embodiment of the present invention.

FIG. 14 is a plan view illustrating Example 2 of the acoustic wave device according to the first preferred embodiment. As illustrated in FIG. 14, an acoustic wave device 1B according to Example 2 differs from Example 1 in that the hollow 9 does not include the extended passages 9*a*. The hollow 9 overlaps and directly communicates with the through holes 10.

In Example 2, the reinforcing support 11 is disposed in a region overlapping the hollow 9 and not overlapping the first and second electrode fingers 3 and 4 in plan view in the Z direction. More specifically, in plan view in the Z direction, four reinforcing supports 11 are each disposed between the through hole 10 and one of electrode fingers 3 and 4 at end portions of the plurality of electrode fingers 3 and 4 in the X direction, and are located at positions not overlapping the through holes 10 and the first and second electrode fingers 3 and 4 in the Y direction. This can reduce or prevent obstruction of the flow of etchant into the hollow 9 during manufacturing of the acoustic wave device 1B. The configuration and shape of the reinforcing supports 11 illustrated in FIG. 14 is merely an example and is not limited to this.

In the acoustic wave device 1, the positions of the reinforcing supports 11 are not limited to those illustrated in FIG. 13A and FIG. 14. Example 3 and Example 4 will be described, with reference to drawings, as examples where the reinforcing supports 11 are disposed in other areas.

Figure 15:
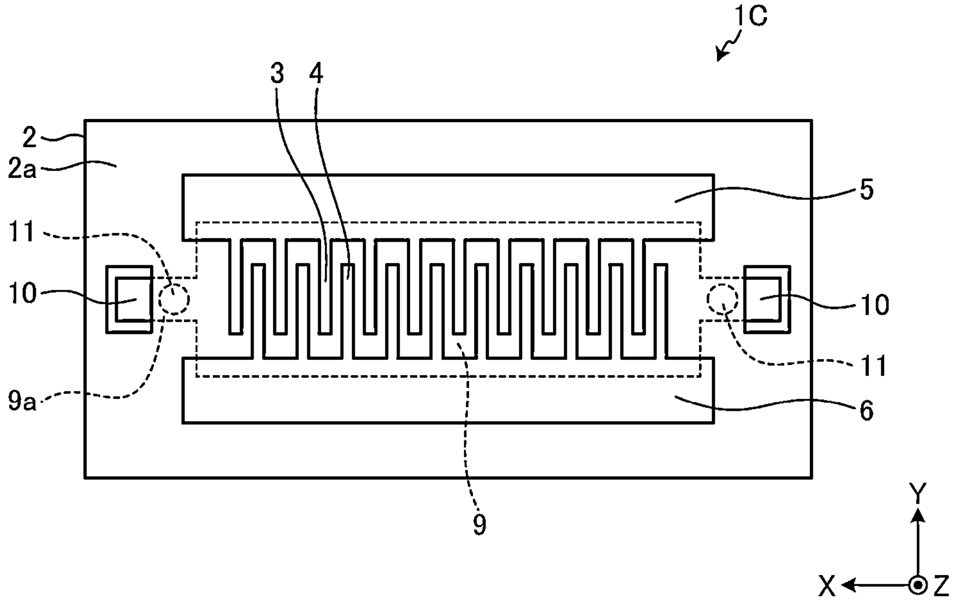
FIG. 15 is a plan view illustrating Example 3 of the acoustic wave device according to the first preferred embodiment of the present invention.

FIG. 15 is a plan view illustrating Example 3 of the acoustic wave device according to the first preferred embodiment. As illustrated in FIG. 15, Example 3 differs from Example 1 in that the reinforcing supports 11 are each disposed inside the extended passage 9*a*. In Example 3, the reinforcing support 11 is disposed inside the extended passage 9*a* at a position not overlapping the through hole 10 in the Z direction. For example, the reinforcing support 11 is a circular column having a length direction in the Z direction. The maximum length of the reinforcing support 11 in the Y direction is preferably smaller than the width of the extended passage 9*a* in the Y direction. This enables the reinforcing support 11 to support the piezoelectric layer 2, and thus can reduce or prevent warpage of the piezoelectric layer 2 and the occurrence of cracks. The configuration and shape of the reinforcing supports 11 illustrated in FIG. 15 is merely an example and is not limited to this.

Figure 16:
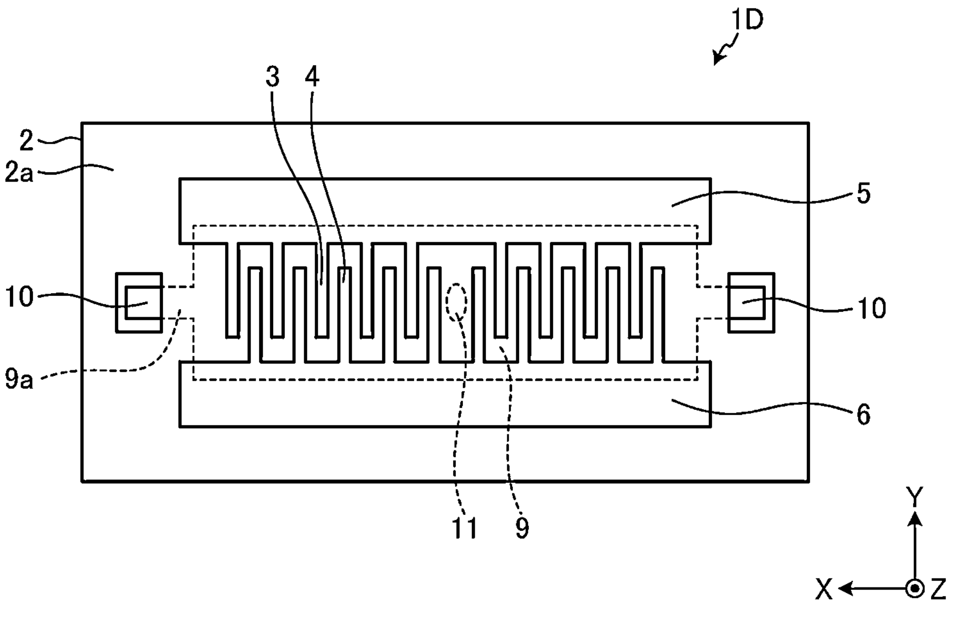
FIG. 16 is a plan view illustrating Example 4 of the acoustic wave device according to the first preferred embodiment of the present invention.

FIG. 16 is a plan view illustrating Example 4 of the acoustic wave device according to the first preferred embodiment. As illustrated in FIG. 16, Example 4 differs from Example 1 and Example 3 in that the reinforcing support 11 is disposed between adjacent electrode fingers 3 or adjacent electrode fingers 4. In Example 4, the reinforcing support 11 is disposed inside the hollow 9. In a plan view from the Z direction, the reinforcing support 11 is disposed between adjacent electrode fingers 3 or adjacent electrode fingers 4 in the X direction. In this case, as illustrated in FIG. 16, the electrode fingers 3 or the electrode fingers 4 are disposed at positions not overlapping the reinforcing support 11 in the Z direction. This enables the reinforcing support 11 to support the piezoelectric layer 2, and thus can reduce or prevent warpage of the piezoelectric layer 2 and the occurrence of cracks. The configuration and shape of the reinforcing support 11 illustrated in FIG. 16 is merely an example and is not limited to this.

The dielectric film 7 is optional for the acoustic wave device 1. In this case, the hollow 9 may be provided in the piezoelectric layer 2 or the support substrate 8. Hereinafter, with reference to drawings, Example 5 will be described as an example where the hollow 9 is provided in the piezoelectric layer 2, and Example 6 will be described as an example where the hollow 9 is provided in the support substrate 8.

Figure 17A:
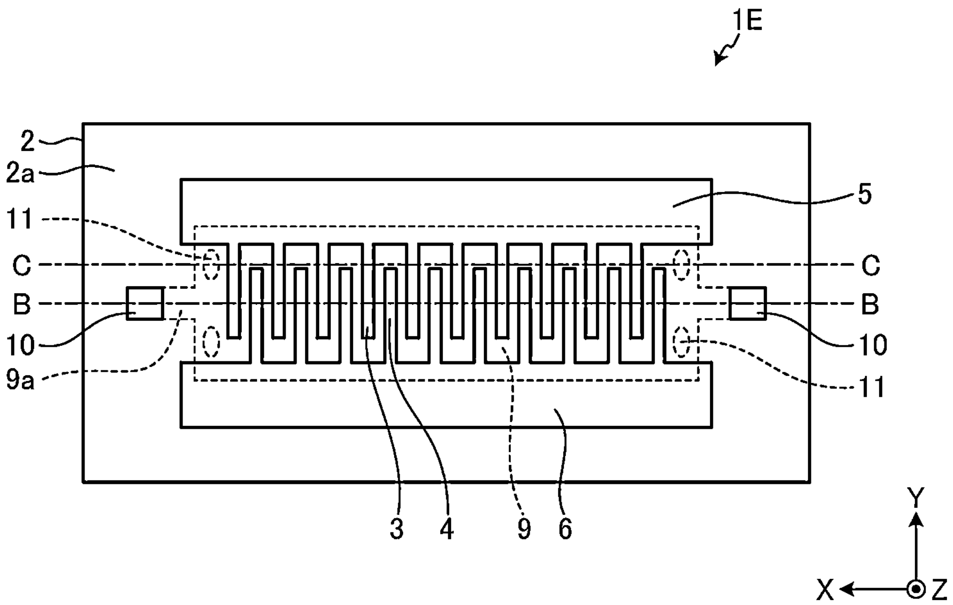
FIG. 17A is a plan view illustrating Example 5 of the acoustic wave device according to the first preferred embodiment of the present invention.
Figure 17B:
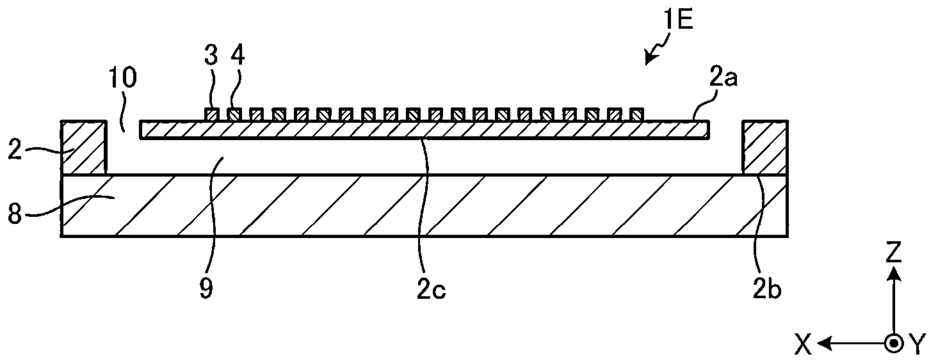
FIG. 17B is a cross-sectional view taken along line B-B of FIG. 17A.
Figure 17C:
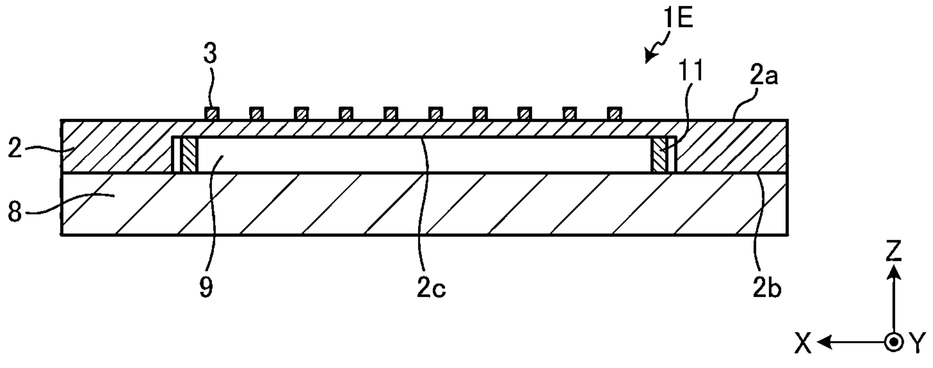
FIG. 17C is a cross-sectional view taken along line C-C of FIG. 17A.

FIG. 17A is a plan view illustrating Example 5 of the acoustic wave device according to the first preferred embodiment. FIG. 17B is a cross-sectional view taken along line B-B of FIG. 17A. FIG. 17C is a cross-sectional view taken along line C-C of FIG. 17A. As illustrated in FIG. 17B, Example 5 differs from Example 1 in that the dielectric film 7 is absent and the hollow 9 is provided in the piezoelectric layer 2. The hollow 9 may thus be a space surrounded by a recess 2*c* in the second principal surface 2*b* of the piezoelectric layer 2 and the surface of the support substrate 8 adjacent to the piezoelectric layer 2.

Figure 18A:
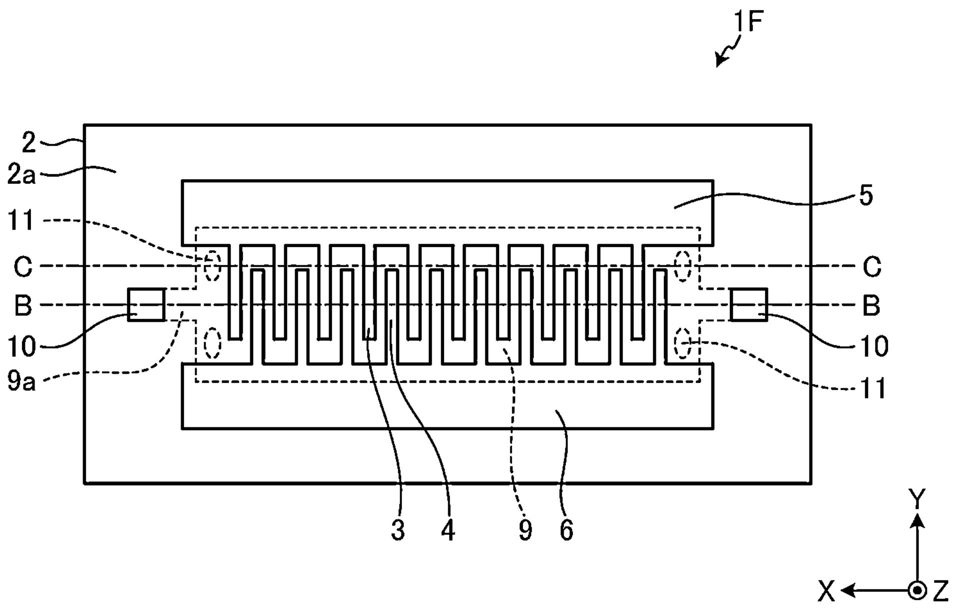
FIG. 18A is a plan view illustrating Example 6 of the acoustic wave device according to the first preferred embodiment of the present invention.
Figure 18B:
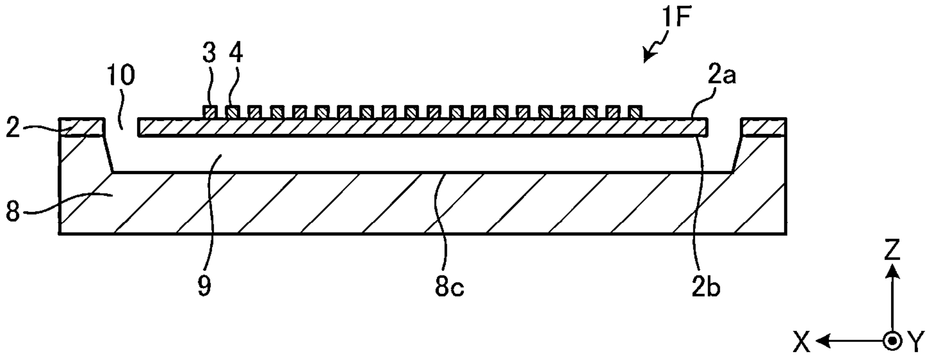
FIG. 18B is a cross-sectional view taken along line B-B of FIG. 18A.
Figure 18C:
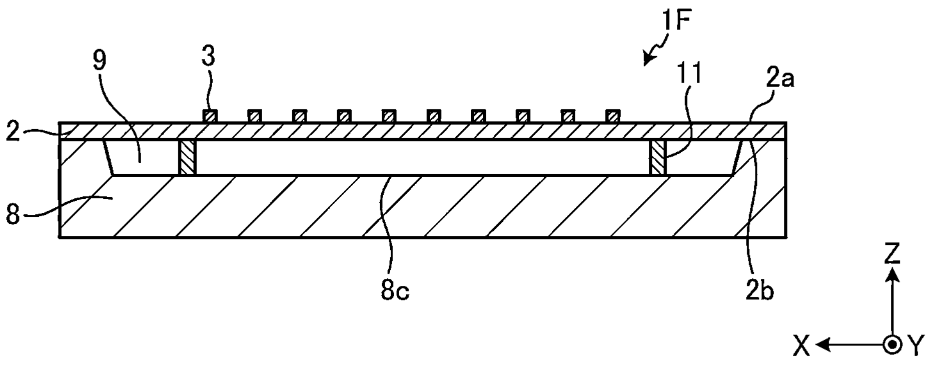
FIG. 18C is a cross-sectional view taken along line C-C of FIG. 18A.

FIG. 18A is a plan view illustrating Example 6 of the acoustic wave device according to the first preferred embodiment. FIG. 18B is a cross-sectional view taken along line B-B of FIG. 18A. FIG. 18C is a cross-sectional view taken along line C-C of FIG. 18A. As illustrated in FIG. 18B, Example 6 differs from Example 1 in that the dielectric film 7 is absent and the hollow 9 is provided in the support substrate 8. The hollow 9 may thus be a space surrounded by the second principal surface 2*b* of the piezoelectric layer 2 and a recess 8*c* in the surface of the support substrate 8 adjacent to the piezoelectric layer 2.

As described above, the acoustic wave devices 1A to 1F according to the first preferred embodiment include the support substrate 8 having a thickness in the first direction, the piezoelectric layer 2 disposed in the first direction of the support substrate 8, and the interdigital transducer electrode disposed on the piezoelectric layer 2 and including the plurality of first electrode fingers 3 and the plurality of second electrode fingers 4. The plurality of first electrode fingers 3 extend in the second direction crossing the first direction, and the plurality of second electrode fingers 4 extend in the second direction and face corresponding ones of the plurality of first electrode fingers 3 in the third direction orthogonal or substantially orthogonal to the second direction. The support substrate 8 and the piezoelectric layer 2 are provided with the hollow 9 therebetween at a position at least partially overlapping the interdigital transducer electrode in the first direction. There is at least one through hole 10 penetrating the piezoelectric layer 2 at a position not overlapping the interdigital transducer electrode in the first direction. The through hole 10 communicates with the hollow 9. The acoustic wave devices 1A to 1F include the reinforcing support 11 extending inside the hollow 9 in the first direction, in a region overlapping the hollow 9 and not overlapping the plurality of first and second electrode fingers 3 and 4 in the first direction.

With the configuration described above, the region of the piezoelectric layer 2 overlapping the hollow 9 in the first direction is supported by the reinforcing support 11 in the hollow 9. This can reduce or prevent warpage of the piezoelectric layer 2 and the occurrence of cracks in the piezoelectric layer 2.

In the acoustic wave devices 1A to 1F according to the first preferred embodiment, the exterior of the reinforcing support 11 includes a curved surface in plan view in the first direction. This can reduce or prevent the reinforcing support 11 from obstructing the flow of etchant into the hollow 9 during manufacturing of the acoustic wave devices 1A to 1F.

The acoustic wave devices 1A to 1D according to the first preferred embodiment further include the dielectric film 7 on the support substrate 8, the hollow 9 is provided in a portion of the dielectric film 7, and the reinforcing support 11 is made of the same material as the dielectric film 7. This facilitates formation of the reinforcing support 11.

In a preferred embodiment of the present invention, the material of the dielectric film 7 includes, for example, at least one of silicon oxide, silicon nitride, and alumina. This makes it possible to provide an acoustic wave device having good resonance characteristics.

In the acoustic wave devices 1A to 1F according to the first preferred embodiment, the material of the reinforcing support 11 may include a metal. The resulting high thermal conductivity of the reinforcing support 11 can improve heat dispersion performance of the acoustic wave devices 1A to 1F.

In the acoustic wave devices 1A to 1C according to the first preferred embodiment, in a plan view from the first direction, the reinforcing support 11 is disposed between the through hole 10 and the first electrode finger 3 or the second electrode finger 4 at an end portion of the plurality of first electrode fingers 3 or the plurality of second electrode fingers 4 in the third direction. This can reduce or prevent warpage of the piezoelectric layer 2 and the occurrence of cracks in the piezoelectric layer 2.

In the acoustic wave devices 1A and 1C according to the first preferred embodiment, the hollow 9 includes the extended passage 9*a* smaller in area than the region of the hollow 9 overlapping the interdigital transducer electrode in the first direction. The reinforcing support 11 is disposed near the extended passage 9*a*. This can reduce or prevent the reinforcing support 11 from obstructing the flow of etchant into the hollow 9 during manufacturing of the acoustic wave devices 1A and 1C.

In the acoustic wave device 1D according to the first preferred embodiment, in a plan view from the first direction, the reinforcing support 11 is disposed between adjacent first electrode fingers 3 or adjacent second electrode fingers 4 of the plurality of first and second electrode fingers 3 and 4. This can reduce or prevent warpage of the piezoelectric layer 2 and the occurrence of cracks in the piezoelectric layer 2.

In a preferred embodiment of the present invention, in the acoustic wave devices 1A to 1F according to the first preferred embodiment, at least two through holes 10 are provided on both sides of the interdigital transducer electrode in the third direction, and the two through holes 10 communicate through the hollow 9. This can facilitate manufacturing of the acoustic wave devices 1A to 1F.

In a preferred embodiment of the present invention, the thickness of the piezoelectric layer 2 is less than or equal to 2*p*, where p is a center-to-center distance between adjacent first and second electrode fingers 3 and 4 of the plurality of first and second electrode fingers 3 and 4. This can reduce the size of the acoustic wave device and improve the Q factor.

In a preferred embodiment of the present invention, the material of the piezoelectric layer 2 includes, for example, lithium niobate or lithium tantalate. This makes it possible to provide an acoustic wave device having good resonance characteristics.

In a preferred embodiment of the present invention, Euler angles (φ, θ, ψ) of lithium niobate or lithium tantalate forming the piezoelectric layer 2 are in the range defined by numerical expression (1), numerical expression (2), or numerical expression (3) described below. This can sufficiently widen the fractional bandwidth.

$$(0°\pm10°,\ 0° \text{ to } 20°,\ \text{any } \psi) \quad \text{numerical expression (1)}$$

$$(0°\pm10°,\ 20° \text{ to } 80°,\ 0° \text{ to } 60° (1-(\theta-50)^2/900)^{1/2}) \text{ or } (0°\pm10°,\ 20° \text{ to } 80°,\ [180°-60° (1-(\theta-50)^2/900)^{1/2}] \text{ to } 180°) \quad \text{numerical expression (2)}$$

$$(0°\pm10°,\ [180°-30° (1-(\psi-90)^2/8100)^{1/2}] \text{ to } 180°,\ \text{any } \psi) \quad \text{numerical expression (3)}$$

In a preferred embodiment of the present invention, d/p about 0.5 is satisfied, where d is the thickness of the piezoelectric layer 2 and p is the center-to-center distance between adjacent first and second electrode fingers 3 and 4 of the plurality of first and second electrode fingers 3 and 4. This can reduce the size of the acoustic wave device and improve the Q factor.

In a preferred embodiment of the present invention, d/p is less than or equal to about 0.24. This can reduce the size of the acoustic wave device and improve the Q factor.

In a preferred embodiment of the present invention, when a region where adjacent electrode fingers overlap as viewed in a direction in which the adjacent electrode fingers face each other is the excitation region C, MR about 1.75(d/p)+0.075 is satisfied, where MR is the metallization ratio of the plurality of electrode fingers to the excitation region C. This can reliably make the fractional bandwidth less than or equal to about 17%.

Second Preferred Embodiment

Figure 19A:
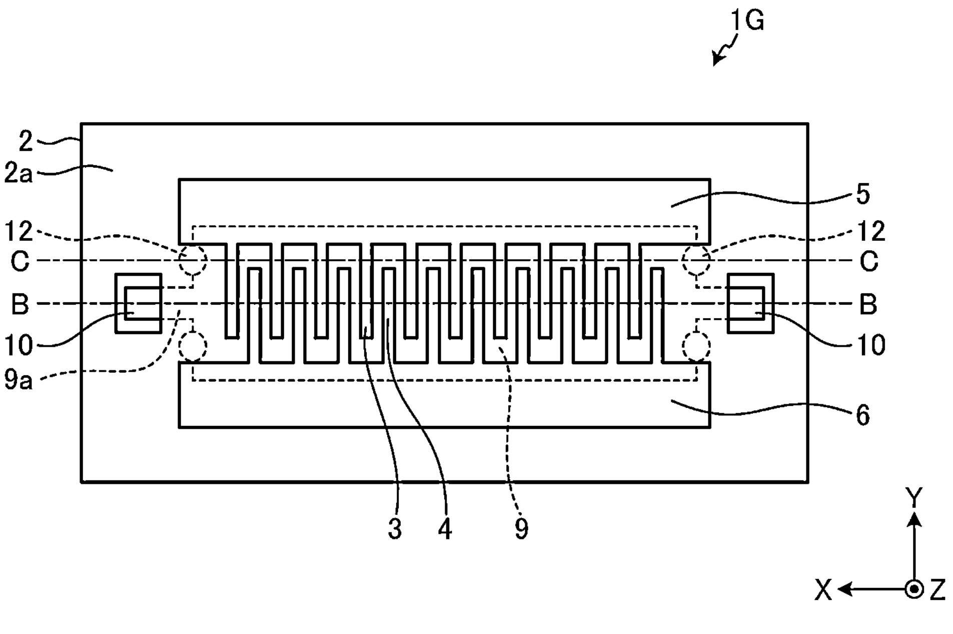
FIG. 19A is a plan view illustrating Example of an acoustic wave device according to a second preferred embodiment of the present invention.
Figure 19B:
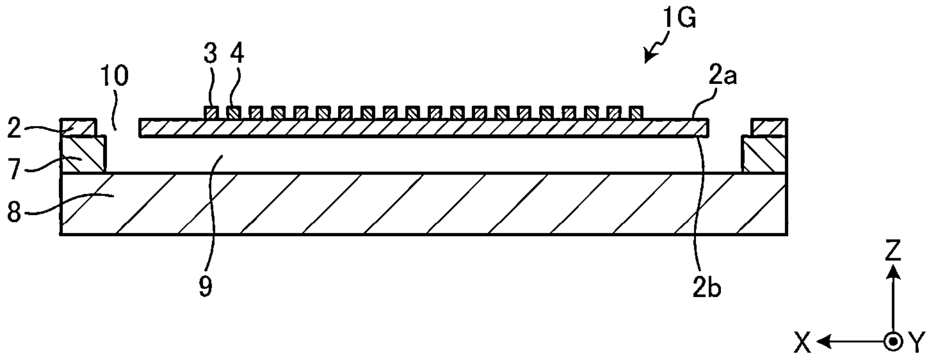
FIG. 19B is a cross-sectional view taken along line B-B of FIG. 19A.
Figure 19C:
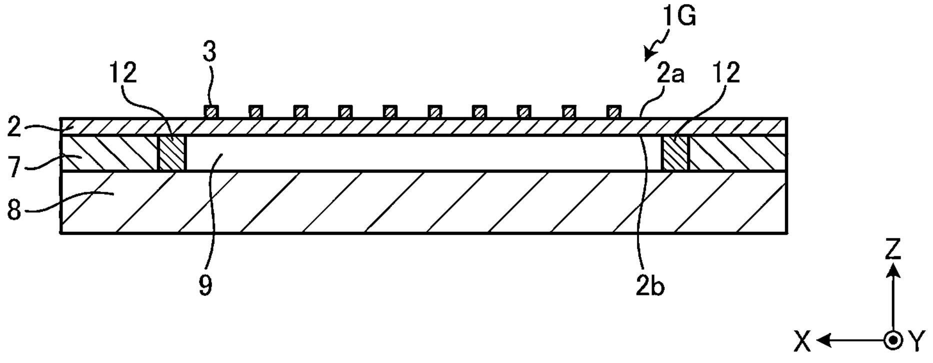
FIG. 19C is a cross-sectional view taken along line C-C of FIG. 19A.

FIGS. 19A to 19C illustrates Example of an acoustic wave device according to a second preferred embodiment of the present invention. An acoustic wave device 1G according to the second preferred embodiment differs from the first preferred embodiment in that the acoustic wave device 1G includes a reinforcing rib 12.

In the second preferred embodiment, the same or corresponding components as those in the first preferred embodiment are denoted by the same reference numerals and their description will be omitted.

The reinforcing rib 12 is disposed on the wall surface of the hollow 9 and configured to support the piezoelectric layer 2 and the support substrate 8. As illustrated in FIG. 19A, the reinforcing rib 12 is disposed in a region not overlapping the first and second electrode fingers 3 and 4 in plan view in the Z direction. The reinforcing rib 12 protrudes from the lateral wall of the hollow 9 (or wall surface of the cavity 7*a*) towards the interior of the hollow 9. That is, a portion of the lateral surface of the reinforcing rib 12 is embedded in the dielectric film 7, and the remaining portion of the lateral surface of the reinforcing rib 12 is exposed to the interior of the hollow 9. As illustrated in FIG. 19C, the upper end of the reinforcing rib 12 in the Z direction is bonded to the piezoelectric layer 2, and the lower end of the reinforcing rib 12 in the Z direction is bonded to the support substrate 8. This enables the reinforcing rib 12 to support the piezoelectric layer 2, and thus can reduce or prevent warpage of the piezoelectric layer 2 and the occurrence of cracks.

In Example, the reinforcing rib 12 is disposed near the extended passage 9*a* in the X direction. More specifically, four reinforcing ribs 12 are disposed on the wall surface of the hollow 9 except the extended passages 9*a* at both ends in the X direction, at positions not overlapping the areas communicating with the extended passages 9*a* in the Y direction. Also, in Example, each reinforcing rib 12 is a cylindrical member having a length in the Z direction. The exterior or lateral surface of the reinforcing rib 12 has a curved surface. This can reduce or prevent obstruction of the flow of etchant into the hollow 9 during manufacturing of the acoustic wave device 1G. The configuration and shape of the reinforcing rib 12 illustrated in FIG. 19A is merely an example and is not limited to this. It is simply required that at least one reinforcing rib 12 is provided. The reinforcing rib 12 may have any shape as long as the lateral surface includes a curved surface.

The reinforcing rib 12 is preferably made of the same material as the dielectric film 7. This can facilitate formation of the reinforcing rib 12 during manufacturing of the acoustic wave device 1G. The reinforcing rib 12 is not limited to this, and may be made of a metal, such as, for example, Ti, Al, Cu, or Ni. The resulting high thermal conductivity of the reinforcing rib 12 can improve heat dispersion performance of the acoustic wave device 1G.

As described above, the acoustic wave device 1G according to the second preferred embodiment includes the support substrate 8 having a thickness in the first direction, the piezoelectric layer 2 disposed in the first direction of the support substrate 8, and the interdigital transducer electrode disposed on the piezoelectric layer 2 and including the plurality of first electrode fingers 3 and the plurality of second electrode fingers 4. The plurality of first electrode fingers 3 extend in the second direction crossing the first direction, and the plurality of second electrode fingers 4 extend in the second direction and face corresponding ones of the plurality of first electrode fingers 3 in the third direction orthogonal or substantially orthogonal to the second direction. The support substrate 8 and the piezoelectric layer 2 are provided with the hollow 9 therebetween at a position at least partially overlapping the interdigital transducer electrode in the first direction. There is at least one through hole 10 penetrating the piezoelectric layer 2 at a position not overlapping the interdigital transducer electrode in the first direction. The through hole 10 communicates with the hollow 9. The acoustic wave device includes the reinforcing rib 12 not overlapping the plurality of first and second electrode fingers 3 and 4 in the first direction. The reinforcing rib 12 protrudes from the lateral wall of the hollow 9 toward the interior of the hollow 9.

With the configuration described above, the region of the piezoelectric layer 2 overlapping the hollow 9 in the first direction is supported by the reinforcing rib 12 in the hollow 9. This can reduce or prevent warpage of the piezoelectric layer 2 and the occurrence of cracks in the piezoelectric layer 2.

In the acoustic wave device 1G according to the second preferred embodiment, the exterior of the reinforcing rib 12 has a curved surface in plan view in the first direction. This can reduce or prevent the reinforcing rib 12 from obstructing the flow of etchant into the hollow 9 during manufacturing of the acoustic wave devices 1G.

The acoustic wave device 1G according to the second preferred embodiment further includes the dielectric film 7 on the support substrate 8, the hollow 9 is provided in part of the dielectric film 7, and the reinforcing rib 12 is made of the same material as the dielectric film 7. This facilitates formation of the reinforcing rib 12.

In the acoustic wave device 1G according to the second preferred embodiment, the material of the reinforcing rib 12 may include a metal. The resulting high thermal conductivity of the reinforcing rib 12 can improve heat dispersion performance of the acoustic wave device 1G.

In the acoustic wave device 1G according to the second preferred embodiment, the hollow 9 includes the extended passage 9*a* smaller in area than the region of the hollow 9 overlapping the interdigital transducer electrode in the first direction. The reinforcing rib 12 is disposed near the extended passage 9*a*. This can reduce or prevent the reinforcing rib 12 from obstructing the flow of etchant into the hollow 9 during manufacturing of the acoustic wave device 1G.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
- a support substrate having a thickness in a first direction;
- a piezoelectric layer on the support substrate; and
- an interdigital transducer electrode on the piezoelectric layer and including a plurality of first electrode fingers and a plurality of second electrode fingers, the plurality of first electrode fingers extending in a second direction crossing the first direction, the plurality of second electrode fingers extending in the second direction and facing corresponding ones of the plurality of first electrode fingers in a third direction orthogonal or substantially orthogonal to the second direction; wherein
- the support substrate and the piezoelectric layer include a hollow therebetween at a position at least partially overlapping the interdigital transducer electrode in the first direction;
- at least one through hole penetrates the piezoelectric layer at a position not overlapping the interdigital transducer electrode in the first direction, and the through hole communicates with the hollow; and
- a reinforcing support extends inside the hollow in the first direction, in a region overlapping the hollow and not overlapping the plurality of first and second electrode fingers in the first direction.

2. The acoustic wave device according to claim 1, wherein an exterior of the reinforcing support includes a curved surface in plan view in the first direction.

3. The acoustic wave device according to claim 1, further comprising:
- a dielectric film on the support substrate; wherein
- the hollow is provided in a portion of the dielectric film; and
- the reinforcing support is made of a same material as the dielectric film.

4. The acoustic wave device according to claim 1, wherein a material of the reinforcing support includes a metal.

5. The acoustic wave device according to claim 1, wherein, in a plan view from the first direction, the reinforcing support is provided between the through hole and the first electrode finger or the second electrode finger at an end portion of the plurality of first and second electrode fingers in the third direction.

6. The acoustic wave device according to claim 1, wherein
- the hollow includes an extended passage smaller in area than a region of the hollow overlapping the interdigital transducer electrode in the first direction; and
- the reinforcing support is located near the extended passage.

7. The acoustic wave device according to claim 1, wherein, in a plan view from the first direction, the reinforcing support is provided between adjacent first electrode fingers or adjacent second electrode fingers of the plurality of first and second electrode fingers.

8. The acoustic wave device according to claim 3, wherein a material of the dielectric film includes at least one of silicon oxide, silicon nitride, or alumina.

9. The acoustic wave device according to claim 1, wherein at least two through holes are provided on both sides of the interdigital transducer electrode in the third direction, and the two through holes communicate through the hollow.

10. The acoustic wave device according to claim 1, wherein a thickness of the piezoelectric layer is less than or equal to about 2p, where p is a center-to-center distance between adjacent first and second electrode fingers of the plurality of first and second electrode fingers.

11. The acoustic wave device according to claim 1, wherein a material of the piezoelectric layer includes lithium niobate or lithium tantalate.

12. The acoustic wave device according to claim 11, wherein Euler angles ($\varphi$, $\theta$, $\psi$) of lithium niobate or lithium tantalate of the piezoelectric layer are in a range defined by numerical expression (1), numerical expression (2) or numerical expression (3):

$$(0°\pm10°,\ 0° \text{ to } 20°,\ \text{any } \psi) \quad \text{numerical expression (1);}$$

$$(0°\pm10°,\ 20° \text{ to } 80°,\ 0° \text{ to } 60°\ (1-(\theta-50)^2/900)^{1/2}) \text{ or } (0°\pm10°,\ 20° \text{ to } 80°,\ [180°-60°\ (1-(\theta-50)^2/900)^{1/2}] \text{ to } 180°) \quad \text{numerical expression (2); and}$$

$$(0°\pm10°,\ [180°-30°\ (1-(\psi-90)^2/8100)^{1/2}] \text{ to } 180°,\ \text{any } \psi) \quad \text{numerical expression (3)}$$

13. The acoustic wave device according to claim 11, wherein d/p about 0.5 is satisfied, where d is a thickness of the piezoelectric layer and p is a center-to-center distance between adjacent first and second electrode fingers of the plurality of first and second electrode fingers.

14. The acoustic wave device according to claim 13, wherein d/p is less than or equal to about 0.24.

15. The acoustic wave device according to claim 13, wherein when a region where adjacent electrode fingers overlap as viewed in a direction in which the adjacent electrode fingers face each other is an excitation region, MR about 1.75(d/p)+0.075 is satisfied, where MR is a metallization ratio of the plurality of electrode fingers to the excitation region.

16. An acoustic wave device comprising:

a support substrate having a thickness in a first direction;

a piezoelectric layer on the support substrate; and an interdigital transducer electrode on the piezoelectric layer and including a plurality of first electrode fingers and a plurality of second electrode fingers, the plurality of first electrode fingers extending in a second direction crossing the first direction, the plurality of second electrode fingers extending in the second direction and facing corresponding ones of the plurality of first electrode fingers in a third direction orthogonal or substantially orthogonal to the second direction; wherein the support substrate and the piezoelectric layer include a hollow therebetween at a position at least partially overlapping the interdigital transducer electrode in the first direction;

at least one through hole penetrating the piezoelectric layer at a position not overlapping the interdigital transducer electrode in the first direction, and the through hole communicates with the hollow; and a reinforcing rib not overlapping the plurality of first and second electrode fingers in the first direction is provided; and the reinforcing rib protrudes from a lateral wall of the hollow toward an interior of the hollow.

17. The acoustic wave device according to claim 16, wherein an exterior of the reinforcing rib includes a curved surface in plan view in the first direction.

18. The acoustic wave device according to claim 16, further comprising:

a dielectric film on the support substrate; wherein the hollow is provided in a portion of the dielectric film; and the reinforcing rib is made of a same material as the dielectric film.

19. The acoustic wave device according to claim 16, wherein a material of the reinforcing rib includes a metal.

20. The acoustic wave device according to claim 16, wherein the hollow includes an extended passage smaller in area than a region of the hollow overlapping the interdigital transducer electrode in the first direction; and the reinforcing rib is located near the extended passage.

* * * * *